June 10, 1969 A. J. MAREK 3,449,595

D.C. BUS SWITCHING POWER CONTACT

Filed Sept. 7, 1965

INVENTOR.

BY Albert J. Marek,

H. H. Locke

Att'ys.

United States Patent Office 3,449,595
Patented June 10, 1969

3,449,595

D.C. BUS SWITCHING POWER CONTACT

Albert J. Marek, Dallas, Tex., assignor, by mesne assignments, to the United States of America as represented by the Secretary of the Navy Filed Sept. 7, 1965, Ser. No. 485,646
Int. Cl. H03k *17/60*
U.S. Cl. 307—252 5 Claims

ABSTRACT OF THE DISCLOSURE

A direct current bus electronic switching power contact having a solid state component with its conduction electrodes in series from a direct current source to a load and with its control electrodes coupled to a relaxation oscillator and driver circuit to switch the solid state component to a condition of conduction during driver oscillations and to reverse bias the solid state component during driver cutoff or short out.

This invention relates to direct current bus switching power contact devices and more particularly to solid state power contact devices under the control of solid state circuitry for statically connecting and disconnecting direct current power to a direct current supply bus.

*Background of the invention*

While contactless switching circuits are known in the use of power transistors and silicon controlled rectifiers (SCR), single power transistors ordinarily cannot conduct sufficient current for direct current (D.C.) power loads and SCR's are not generally very adaptable to D.C. power switching due to difficulty in turning the device "off." Except for the "turn-off" problem, SCR's are well suited for D.C. bus switching applications of the static or contactless type. Where D.C. buses are designed to carry about 50 amperes at a minimum of 100 volts, the power transistor, if used, must be used in parallel or in a controlled series configuration to withstand the high current demand.

*Summary of the invention*

In the present invention two embodiments utilize SCR's as power switches while two other embodiments utilize power transistors as power switches. In the embodiments using SCR's, solid state relaxation oscillators are coupled to the control electrodes of the SCR's to maintain them in a conductive state to connect the D.C. supply voltage with the D.C. bus by a commutating effect as long as the oscillator produces a continuous chain of triggering pulses. The relaxation oscillator is coupled to the SCR gating control electrodes through an isolating transformer such that the last triggering pulse will back bias the SCR sufficiently to cut off conduction therethrough by the reversal of current through the transformer secondary. Accordingly, the power contact is turned "off" by commutating the loaded bus. In another embodiment the SCR connecting the D.C. supply to the load need not be cut off, but a parallel circuit may be used to bypass the SCR thereby turning it off. Power transistors used in series or parallel as power contacts will cut off as soon as the commutating signals cease. It is therefore a general object of this invention to provide a D.C. bus solid state or static switching power contact to produce rapid connect and disconnect of a D.C. voltage supply to a D.C. loaded bus.

*Brief description of the drawing*

These and other objects and the attendant advantages, features, and uses will become more apparent to those skilled in the art as a more detailed description proceeds when considered along with the accompanying drawing in which.

*Description of the preferred embodiments*

Figures 1, 2, 3, 4:
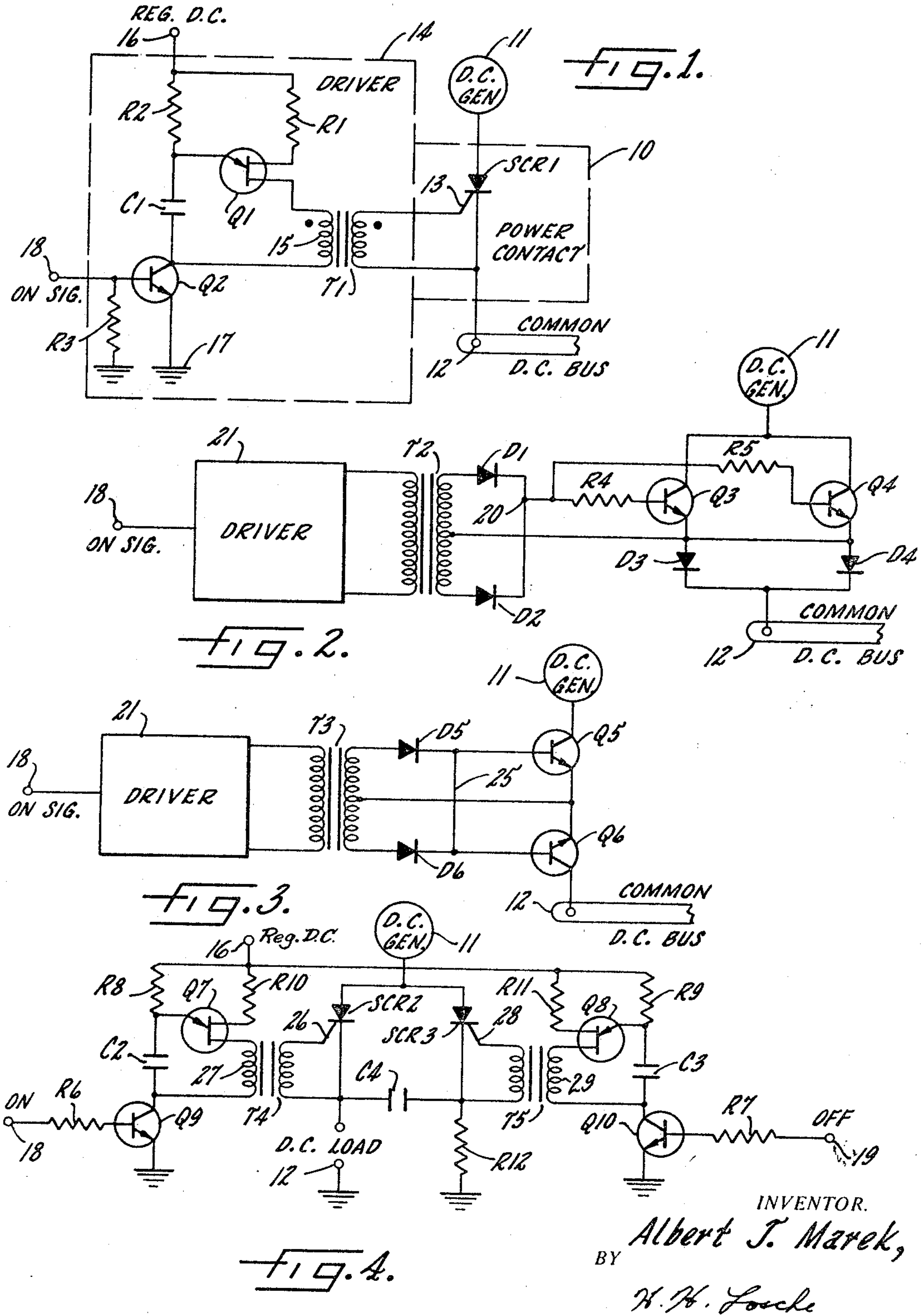
FIGURE 1 is a circuit schematic of one embodiment of an SCR switching contact.
FIGURE 2 is a partially schematic and block diagram of another embodiment utilizing transistors in parallel for a contact switching device.
FIGURE 3 is a partially schematic and block diagram of another embodiment utilizing transistors in series for the switching power contact.
FIGURE 4 is a circuit schematic diagram of an SCR switching power contact having a parallel SCR switch to provide disconnect of the SCR power contact.

Referring more particularly to FIGURE 1 of the drawing, a power contact device 10 utilizes an SCR1 having its anode coupled to a D.C. generator or supply voltage source 11 and its cathode coupled to a common D.C. bus 12 for D.C. voltage supply to one or more D.C. loads. The SCR has a gating electrode 13 to which positive voltages may be applied to open the gating SCR1 thereby closing the power contact between the D.C. supply source 11 for the D.C. loaded bus 12.

To supply the switching control voltages to the gating terminal 13 of the SCR1, a driver circuit 14, shown within dotted lines, utilizes a unijunction transistor relaxation oscillator circuit consisting of a unijunction transistor Q1, resistors R1, R2, capacitor C1, and the primary 15 of an isolation coupling transformer T1, the secondary of which is coupled to the gating electrode 13 and cathode of the SCR1. The unijunction relaxation oscillator in the driver circuit 14 is of a well-known conventional design except that the resistive load on the second base is the primary winding 15 corresponding to a fixed resistance in the normal circuit. The driver circuit 14, including the unijunction relaxation oscillator circuit, is supplied a regulated D.C. voltage at terminal 16 which utilizes ground as the other electrode. Ground or other fixed potential 17 is coupled to the unijunction relaxation oscillator circuit through a transistor amplifier Q2, the collector of which is coupled to the unijunction relaxation oscillator and the emitter of which is coupled to the ground or fixed potential 17. The base electrode of the transistor Q2 is biased from ground through a resistor R3, the base electrode having a terminal 18 to which voltage signals may be applied to place transistor Q2 into conduction thereby placing the unijunction relaxation oscillator in circuit for producing oscillations in the primary 15 of transformer T1. The transistor amplifier Q2 should be of high gain and may be an NPN or PNP type, the NPN type transistor being shown herein purely for the purpose of example.

Let it be assumed that the circuit of FIGURE 1 is in a quiescent state and that the SCR is in its closed gate or nonconductive condition. When it is desirable to connect the D.C. voltage source 11 to the D.C. loaded bus 12, it is only necessary to apply positive voltage to terminal 18 as an "on" signal which places the transistor Q2 into conduction thereby placing the unijunction relaxation oscillator into operation to produce oscillations at a frequency designed into the circuit by the time constant established by R2, C1. The oscillations in the primary 15 of transformer T1 will be induced in the secondary in a commutating manner, the first positive pulse on the gating electrode 13 of the SCR placing this SCR into conduction. As the oscillating signals or triggering signals are produced and applied to the gating electrode 13 the SCR will be gated "on" and "off" at the frequency of the unijunction relaxation oscillator commutating the D.C. voltage source 11 to the D.C. bus 12. When the "on" signal is removed from the terminal 18, the unijunction relaxation oscillator will cease and the trailing edge of the last triggering pulse will reverse bias the SCR sufficiently to cut it off. It is well recognized that once a gating SCR is turned "on" the forward current through the SCR will maintain the SCR in a conductive state—although the gating pulse is removed—until a reverse bias is produced across the gating electrode 13 and the cathode, such as the trailing edge of the last triggering pulse. The commutating signal pulses function to cut off SCR1 by the inherent voltage drop in the last signal. By applying a continuous chain of triggering pulses to the gating electrode 13 of the SCR during the "on" signal at terminal 18, the SCR will be prevented from turning "off" or going into a nonconductive state during low voltage transient conditions across the anode and cathode of this SCR. Accordingly, a static and contactless power contact is provided to rapidly control power from the D.C. voltage source 11 to a loaded D.C. bus 12 in accordance with "on" and "off" signals applied to terminal 18. While the "on-off" signals may be applied manually, the circuit is especially designed for high speed operation such that the terminal 18 may be coupled to any automatic controlling source, such as a logic circuit, or the like. The SCR used as the power contact in FIGURE 1 may be chosen from any of the current-voltage rated SCR's, it being possible to obtain such SCR's to handle 50 amperes with a forward and reverse blocking voltage of at least 100 volts. Such SCR's are also known to operate in temperature ranges of −54° C. to +85° C. without loss of desirable switching characteristics.

Referring more particularly to FIGURE 2, where like parts are shown with like reference characters, a power contact is shown utilizing a pair of power transistors Q3 and Q4 in parallel between the D.C. voltage source 11 and the D.C. loaded bus 12. The power transistors have their collectors coupled in parallel to the D.C. voltage source 11 and their emitters coupled in parallel through diodes D3 and D4 to the bus 12. The rectifying diodes D3 and D4 in the emitter leads are necessary to provide the required reverse voltage rating of the power transistors. The common coupling of the emitters for transistors Q3 and Q4 through the diodes D3 and D4 is coupled to the D.C. bus 12. The bases of power transistors Q3 and Q4 are coupled in parallel through resistors R4 and R5 to a common terminal 20 from a driver circuit. A driver circuit 21, shown in block, may be of any well known type producing full wave alternating or oscillating triggering currents to the primary winding of an isolation coupling transformer T2. This driver circuit is preferably of the full-wave unijunction trigger circuit type, as shown by the driver 14 in FIGURE 1. The secondary winding of the isolation transformer T2 is center-tapped and coupled in common to the emitters of transistors Q3 and Q4, the output leads of the secondary winding being coupled through diodes D1 and D2 oriented in the same direction and having the cathodes thereof coupled to terminal 20 to rectify the rise and collapse of the alternating or oscillating triggering currents.

Power transistors are better suited for D.C. circuits than are SCR's; however, power transistors with sufficient current and reverse voltage ratings are not available for D.C. bus switching. Appropriate parallel arrangements of power transistors will permit their use in high current applications such as bus switching if they can be made to take equivalent loads. To equalize the current flow through the power transistors Q3 and Q4 these transistors should be matched, or feedback resistors should be used, to compensate for variation between the individual units. The contact drop is higher than is obtained with SCR's due to the required rectifiers D3 and D4.

The operation of the device shown in FIGURE 2 is similar to that of FIGURE 1 in that whenever an "on" signal is applied to terminal 18 the relaxation oscillator in the driver circuit 21 will produce oscillations which will be full wave rectified by the diode rectifiers D1 and D2 to turn "on" or place both power transistors Q3 and Q4 into conduction simultaneously in accordance with the frequency of the rectified voltage input at terminal 20. The removal of the "on" signal at terminal 18 removing the positive triggering pulses from the bases of power transistors Q3 and Q4 will immediately cause disconnection of the power contact.

Referring more particularly to FIGURE 3, here again like reference characters apply to like parts, the power contact herein consisting of power transistors Q5 and Q6 are coupled in back-to-back series between the D.C. supply 11 and the D.C. load 12. This back-to-back series coupling is obtained by connecting the collector of power transistor Q5 to the D.C. voltage source 11 and the collector of power transistor Q6 to the D.C. load 12 with the emitters of Q5 and Q6 coupled in common. The common emitter coupling of power transistors Q5 and Q6 is coupled to a center tap of an isolation transformer T3, the primary of which is coupled to a driver circuit which may be identical to the driver circuit used in FIGURE 2. The secondary leads of transformer T3 are coupled through rectifying diodes D5 and D6 having their cathodes coupled in common by connecting lead 25, this connecting lead 25 being coupled in common to the base of each power transistors Q5 and Q6. Whenever an "on" signal is applied to terminal 18, the full wave rectification of the currents inducted in the secondary of the isolation transformer T3 will be rectified and applied to both bases of power transistors Q5 and Q6 thereby connecting the D.C. voltage source to the D.C. loaded bus. In this example the power contact using the power transistors Q5 and Q6 can be used as a low drop switch. This concept will provide a higher bus voltage since the drop across one transistor will be offset by the drop across the other transistor. Theoretically a zero drop can be obtained. However, this circuit is only useful where lower current requirements are demanded by the D.C. loads since the current demand cannot be greater than the current capabilities of either power transistor.

Referring more particularly to FIGURE 4, where again like reference characters are used for like parts, a SCR2 is used as a power contact between the source 11 and load 12. The gating electrode 26 is coupled through a secondary winding of an isolation transformer T4 to its cathode, the primary winding being coupled to a unijunction relaxation oscillator circuit consisting of a unijunction transistor Q7, a timing circuit R8, C2, and first and second base loads R10 and primary winding 27, in like manner as described for the driver circuit in FIGURE 1. An amplifier transistor Q9 provides the "on" switch circuit for the unijunction relaxation oscillator circuit, the base of which is coupled through a resistor R6 to the "on" terminal 18. A similar circuit providing a somewhat symmetrical "off" circuit arrangement is shown utilizing SCR3 providing a switch contact between the D.C. voltage source 11 and a fixed potential, such as ground through a load resistor R12. The resistor R12 will be chosen to be of less resistance than any of the loads on bus 12. The gating electrode 28 of SCR3 is coupled to a driver circuit tnrough an isolating transformer T5, the driver circuit including a unijunction relaxation oscillator consisting of the elements Q8, R11, R9, C3, and primary winding 29 of isolation transformer T5 in like manner as used in the "on" circuit for the power contact SCR2. Transistor Q10 provides an amplifier switch for the "off" signal applied at terminal 19 through the resistor R7 to the base of this transistor Q10.

By the circuit arrangement of FIGURE 4 after an "on" signal is applied to switch the power contact SCR2 into conduction to connect the D.C. voltage supply 11 to the D.C. load 12, this power contact connection will remain as long as "on" signals are applied to terminal 18. Where "off" signals are applied from a separate source to terminal 19, as from a separate logic circuit, the driver circuit will apply a gating voltage to the gating terminal 28 of SCR3 placing SCR3 into conduction through resistor R12. Since the resistor R12 is of lighter load than the normal D.C. loads on the D.C. bus 12, the D.C. load circuit of bus 12 is bypassed removing the voltage differential across SCR2 thereby disconnecting the D.C. source from the D.C. load bus 12. As is well known of SCR's when a current is interrupted from the anode to cathode of an SCR, it will disconnect in the same manner as a mechanical switch. It is to be understood that the "off" circuit coupled to the SCR3 could be a pure mechanical switch such as a relay or the like, but such a mechanical switch cannot approach the speed of operation of the solid state switch shown and described herein.

While many modifications and changes may be made in the constructional details and features of this invention without departing from the spirit of the invention as described herein, it is to be understood that I desire to be limited in my invention only by the scope of the appended claims.

I claim:

1. A direct current bus switching power contact device comprising:

a direct current voltage source and a direct current bus coupled to direct current voltage loads;

solid state power contact switching means having conduction electrodes therethrough coupled between said direct current voltage source and said direct current bus and voltage loads, said conduction electrodes being controlled in conduction by control electrode means; and driver circuit means including a unijunction transistor relaxation oscillator to produce a continuous chain of trigger pulses on an output thereof coupled through an isolation transformer to said control electrode means of said solid state power contact means to produce conduction of the latter, said relaxation oscillator having a transistor switch connected thereto having its collector coupled to said relaxation oscillator and its emitter coupled to a fixed potential and having its base biased through a resistor to said fixed potential, said base electrode adaptable to have voltages of either of two levels applied thereto, one voltage level to place said transistor switch into conduction to cause said relaxation oscillator to oscillate and the other voltage level to prevent conduction of said transistor switch to cause said relaxation oscillator to be quiescent whereby said solid state power contact switching means will couple and decouple said direct current voltage source and said direct current bus, in accordance with the operation of said driver circuit means.

2. A direct current bus switching power contact device as set forth in claim 1 wherein said solid state power contact switching means includes a pair of parallel coupled transistors with the parallel coupled emitters and parallel coupled collectors constituting said conduction electrodes and said parallel coupled bases constitutes said control electrode means.

3. A direct current bus switching power contact device as set forth in claim 1 wherein said solid state power contact switching means includes a pair of transistors coupled with the emitter and collector electrodes constituting said conduction electrodes in series between said direct current voltage source and said direct current bus and the base electrodes of said pair of transistors being coupled in common constituting said control electrode means.

4. A direct current bus switching power contact circuit device comprising:

a direct current voltage source and a direct current load supply bus;

first and second silicon controlled rectifiers each having an anode coupled in common to said direct current voltage source, the first having a cathode coupled to said direct current load supply bus, the second having a cathode coupled to resistance load, and each having a control electrode;

a first solid state relaxation oscillator circuit coupled to said control electrode of said first silicon controlled rectifier and a second solid state relaxation oscillator circuit coupled to said control electrode of said second silicon controlled rectifier, each relaxation oscillator circuit maintaining the respective silicon controlled rectifier in a conductive state when oscillating; and a first and a second transistor switch each having an emitter and collector coupled in said first and second relaxation oscillator circuits, respectively, to place said delaxation oscillator circuits into oscillation when said respective transistor switch is conducting and each transistor switch having a base electrode adaptable to receive a switching voltage whereby said direct current voltage source is switched to said bus when said first transistor switch is switched to its conductive state and said direct current voltage source is disconnected from said bus when said second transistor switch is switched to its conductive state.

5. A direct current bus switching power contact circuit as set forth in claim 4 wherein said first and second relaxation oscillator circuits are each unijunction transistor relaxation oscillator circuits, and said first and second relaxation oscillator circuits are each coupled to said control electrodes of said first and second silicon controlled rectifiers, respectively, through isolation transformers.

References Cited

UNITED STATES PATENTS

| | | | |
|---|---|---|---|
| 3,098,949 | 7/1963 | Goldberg | 307—252 XR |
| 3,229,111 | 1/1966 | Schumacher et al. | 307—283 XR |
| 3,260,962 | 7/1966 | Draper | 307—283 XR |

ARTHUR GAUSS, *Primary Examiner.*

JOHN ZAZWORSKY, *Assistant Examiner.*

U.S. Cl. X.R.

307—247, 254; 331—111